(12) United States Patent
Kishimoto et al.

(10) Patent No.: US 12,082,483 B2
(45) Date of Patent: Sep. 3, 2024

(54) DISPLAY DEVICE

(71) Applicant: Samsung Display Co., Ltd., Yongin-si (KR)

(72) Inventors: Hirotsugu Kishimoto, Hwaseong-si (KR); Dasom Gu, Asan-si (KR); Yongchan Jeon, Cheonan-si (KR); Chul Ho Jeong, Seoul (KR); Hyun-Been Hwang, Suwon-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 440 days.

(21) Appl. No.: 17/551,762

(22) Filed: Dec. 15, 2021

(65) Prior Publication Data

US 2022/0310947 A1 Sep. 29, 2022

(30) Foreign Application Priority Data

Mar. 29, 2021 (KR) ........................ 10-2021-0040688

(51) Int. Cl.
| | |
|---|---|
| *H10K 77/00* | (2023.01) |
| *B32B 3/26* | (2006.01) |
| *B32B 7/12* | (2006.01) |
| *B32B 17/10* | (2006.01) |
| *B32B 27/08* | (2006.01) |
| *B32B 27/28* | (2006.01) |
| *B32B 27/36* | (2006.01) |
| *H10K 77/10* | (2023.01) |
| *H10K 102/00* | (2023.01) |

(52) U.S. Cl.
CPC ............ *H10K 77/111* (2023.02); *B32B 3/266* (2013.01); *B32B 7/12* (2013.01); *B32B 17/10* (2013.01); *B32B 27/08* (2013.01); *B32B 27/281* (2013.01); *B32B 27/36* (2013.01); *B32B 2307/558* (2013.01); *B32B 2307/732* (2013.01); *B32B 2457/206* (2013.01); *H10K 2102/311* (2023.02)

(58) Field of Classification Search
CPC ........................ H10K 77/111; H10K 2102/311
See application file for complete search history.

(56) References Cited

U.S. PATENT DOCUMENTS

| | | |
|---|---|---|
| 2020/0266368 A1 | 8/2020 | Park et al. |
| 2021/0027667 A1* | 1/2021 | Lee .................. G02F 1/133305 |
| 2021/0095168 A1 | 4/2021 | Kishimoto |

FOREIGN PATENT DOCUMENTS

| | | |
|---|---|---|
| JP | 2000-234079 A | 8/2000 |
| KR | 1020200101574 A | 8/2020 |
| KR | 1020210039542 A | 4/2021 |

* cited by examiner

*Primary Examiner* — Anne M Hines
(74) *Attorney, Agent, or Firm* — CANTOR COLBURN LLP

(57) ABSTRACT

A display device includes a display panel foldable about a folding axis, a window on the display panel, a protective film on the window, and a plurality of adhesive layers between the window and the protective film. The adhesive layers include a first adhesive layer on the window and a second adhesive layer on the first adhesive layer. The first adhesive layer includes a side chain crystalline polymer, and the second adhesive layer has a modulus smaller than a modulus of the first adhesive layer.

20 Claims, 16 Drawing Sheets

DISPLAY DEVICE

This application claims priority to Korean Patent Application No. 10-2021-0040688, filed on Mar. 29, 2021, and all the benefits accruing therefrom under 35 U.S.C. § 119, the contents of which are hereby incorporated by reference in its entirety.

BACKGROUND

1. Field

The present disclosure relates to a display device. More particularly, the present disclosure relates to a foldable display device.

2. Description of the Related Art

A display device displays various images through a display screen to provide a user with information. Flexible display devices including a flexible display panel that is foldable are being developed. Since the shape of the flexible display device is changed in various ways, convenience of transporting of the flexible display device regardless of an original screen size is improved.

SUMMARY

A protective film is applied to a display device to protect a display surface of the display device. However, the protective film is easily peeled off from the display surface of the display device according to an operation of the display device or causes a damage to the display surface of the display device during a replacement process thereof.

The present disclosure provides a display device including a protective film that is not peeled off even though the display device is repeatedly folded and unfolded and does not cause a damage on components of the display device when the protective film is replaced.

Embodiments provide a display device including a display panel foldable about a folding axis extending in a first direction, a window on the display panel, a protective film on the window, and a plurality of adhesive layers between the window and the protective film. The adhesive layers include a first adhesive layer on the window and a second adhesive layer on the first adhesive layer. The first adhesive layer includes a side chain crystalline polymer, and a modulus of the second adhesive layer is less than a modulus of the first adhesive layer.

The first adhesive layer may have a first adhesive force at room temperature and has a second adhesive force at a temperature equal to or greater than about 70 degrees Celsius, and the second adhesive force is equal to or less than about 50% of the first adhesive force.

An adhesive force of the second adhesive layer may be greater than the second adhesive force at the temperature equal to or greater than about 70 degrees Celsius.

The side chain crystalline polymer may include at least one of a cetyl (meth)acrylate copolymer, a stearyl (meth) acrylate copolymer, an eicosyl (meth)acrylate copolymer, and a behenyl (meth)acrylate copolymer.

A thickness of the first adhesive layer may be smaller than a thickness of the second adhesive layer.

The first adhesive layer may have a thickness equal to or greater than about 5 μm and equal to or less than about 25 μm.

The second adhesive layer may have a thickness equal to or greater than about 10 μm and equal to or less than about 100 μm.

The modulus of the second adhesive layer may be about 0.2 megapascal (MPa) at minus 20 degrees Celsius.

At least one of the first adhesive layer and the second adhesive layer may further include a foaming agent.

A content of the foaming agent in the first adhesive layer may be equal to or less than about 3%.

A content of the foaming agent in the second adhesive layer may be equal to or less than about 3%.

The display device may further include a support module under the display panel, and the display panel may include a first non-folding area, a folding area, and a second non-folding area which are arranged in a second direction crossing the first direction. The support module may include a cushion layer under the display panel and a support plate under the cushion layer.

The support plate may include a first supporter overlapping the first non-folding area and a second supporter which is spaced apart from the first supporter in the second direction and overlapping the second non-folding area.

The support plate may be provided with a plurality of openings defined therein to overlap the folding area.

Embodiments provide a display device including a display panel foldable, a window on the display panel, a protective film on the window, and a plurality of adhesive layers between the window and the protective film. The adhesive layers include a first adhesive layer on the window and a second adhesive layer on the first adhesive layer and contacting with the first adhesive layer. The first adhesive layer has a first adhesive force at room temperature and has a second adhesive force at a temperature equal to or greater than about 70 degrees Celsius, the second adhesive layer has a third adhesive force at the temperature equal to or greater than about 70 degrees Celsius, and the second adhesive force is less than the third adhesive force and is equal to or less than about 50% of the first adhesive force.

The first adhesive layer may have a thickness equal to or greater than about 5 μm and equal to or less than about 25 μm, and the second adhesive layer may have a thickness equal to or greater than about 10 μm and equal to or less than about 100 μm.

The first adhesive layer may include a side chain crystalline polymer.

The side chain crystalline polymer may include at least one of a cetyl (meth)acrylate copolymer, a stearyl (meth) acrylate copolymer, an eicosyl (meth)acrylate copolymer, and a behenyl (meth)acrylate copolymer.

A modulus of the second adhesive layer may be less than a modulus of the first adhesive layer.

At least one of the first adhesive layer and the second adhesive layer may further include a foaming agent.

According to one or more embodiment described above, the display device is provided with the protective film that is not easily peeled off even though the display device is repeatedly folded and unfolded.

In addition, the protective film is easily replaced without causing damage to components of the display device when the protective film is replaced.

BRIEF DESCRIPTION OF THE DRAWINGS

The above and other advantages of the present disclosure will become readily apparent by reference to the following detailed description when considered in conjunction with the accompanying drawings where.

DETAILED DESCRIPTION

Figure 1:
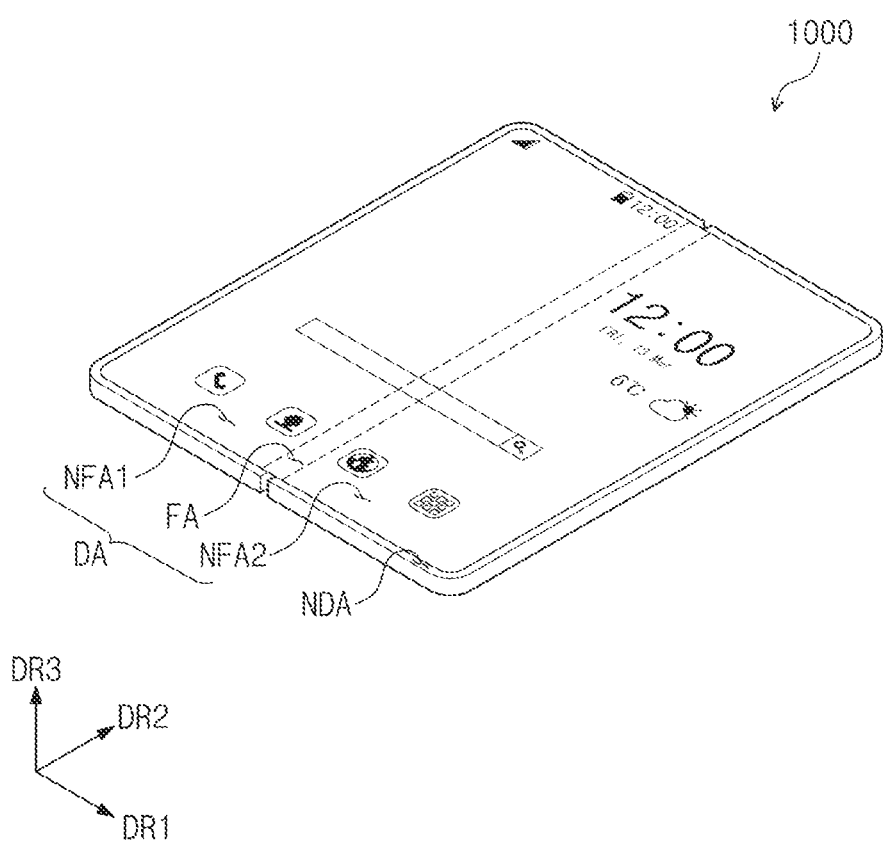
FIG. 1 is a perspective view showing an embodiment of a display device.

The present disclosure may be variously modified and realized in many different forms, and thus embodiments will be exemplified in the drawings and described in detail hereinbelow. However, the present disclosure should not be limited to the disclosed forms, and be construed to include all modifications, equivalents, or replacements included in the spirit and scope of the present disclosure.

In the present disclosure, it will be understood that when an element or layer is referred to as being related to another element such as being "on", "connected to" or "coupled to" another element or layer, it can be directly on, connected or coupled to the other element or layer or intervening elements or layers may be present. In contrast, when an element or layer is referred to as being related to another element such as being "directly on", "directly connected to" or "directly coupled to" another element or layer, no other element or layer or intervening elements or layers is present.

Like numerals refer to like elements throughout. A reference number may indicate a singular element or a plurality of the element. For example, a reference number labeling a singular form of an element within the drawing figures may be used to reference a plurality of the singular element within the text of specification.

In the drawings, the thickness, ratio, and dimension of components are exaggerated for effective description of the technical content.

It will be understood that, although the terms first, second, etc. may be used herein to describe various elements, these elements should not be limited by these terms. These terms are only used to distinguish one element from another element. Thus, a first element discussed below could be termed a second element without departing from the teachings of the present disclosure.

The terminology used herein is for the purpose of describing particular embodiments only and is not intended to be limiting. As used herein, the singular forms, "a", "an" and "the" are intended to include the plural forms as well, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Spatially relative terms, such as "beneath", "below", "lower", "above", "upper" and the like, may be used herein for ease of description to describe one element or feature's relationship to another elements or features as shown in the figures.

It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Unless otherwise defined, all terms including technical and scientific terms used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of a display device 1000 will be explained in detail with reference to the accompanying drawings.

Figure 2A:
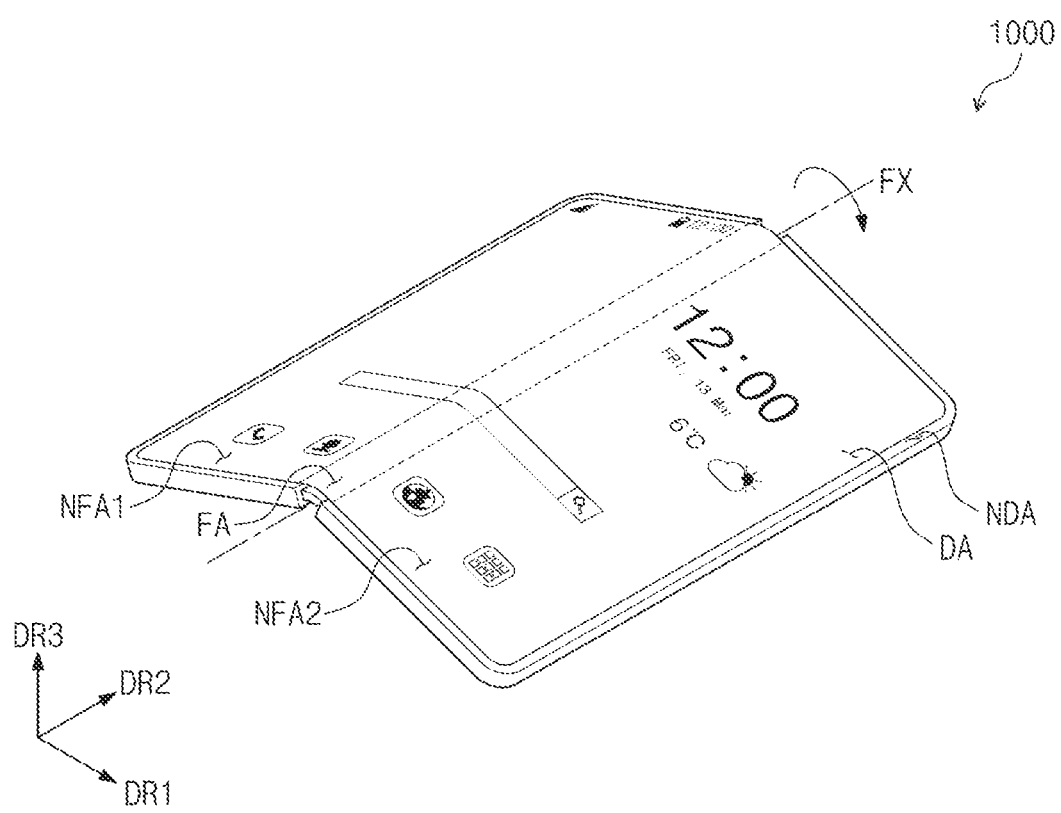
FIGS. 2A to 2C are perspective views showing embodiments of a display device.
Figure 2B:
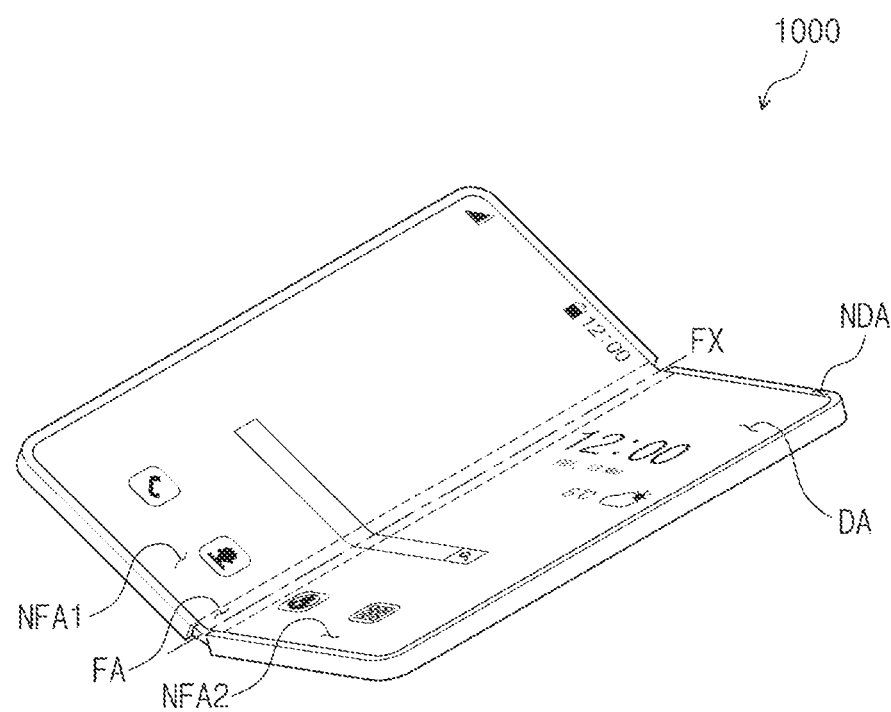
Figure 2B:
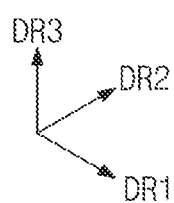
Figure 2C:
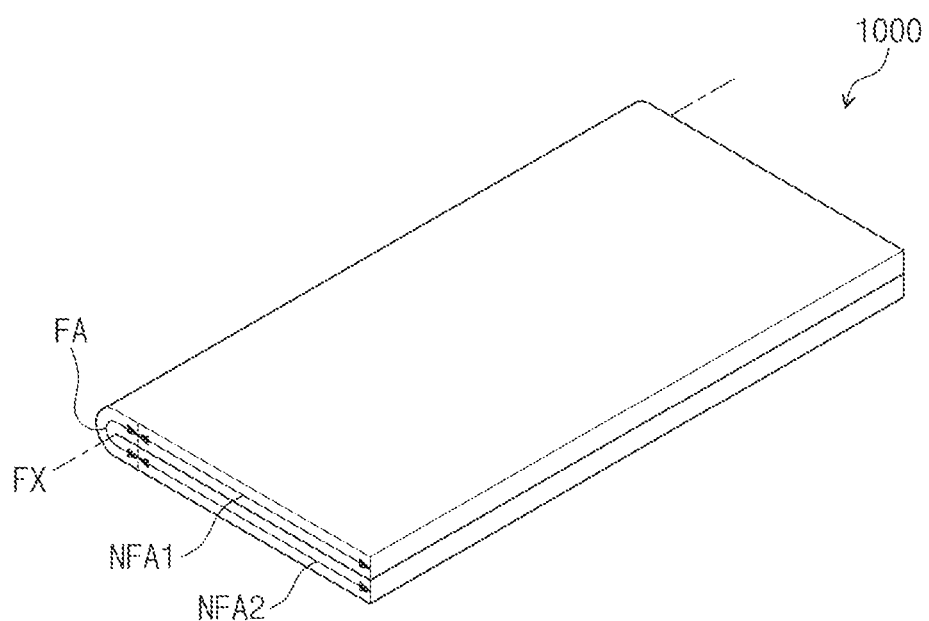
Figure 2C:
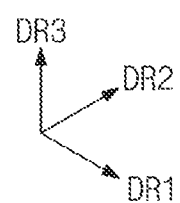

FIGS. 1 and 2A to 2C are perspective views showing embodiments of a display device 1000. FIG. 1 shows the display device 1000 which is unfolded, and FIGS. 2A to 2C show the display device 1000 which is folded.

The display device 1000 may be a device that is activated in response to electrical signals. The display device 1000 may be applied to various electronic devices. In an embodiment, for example, the display device 1000 may be applied to electronic devices, such as a mobile phone, a smart watch, a tablet computer, a notebook computer, a computer, a smart television, etc. The display device 1000 may be applied to other electronic devices as long as not departing from the scope of the invention. FIG. 1 shows the display device 1000 applied to the mobile phone.

The display device 1000 may display an image to outside the display device 1000. A front surface of the display device 1000 may include a display area DA and a non-display area NDA. The front surface of the display device 1000 may be substantially parallel to a plane defined by a first direction DR1 and a second direction DR2 crossing each other. The front surface of the display device 1000 may correspond to a display surface through which the image is displayed.

The display device 1000 may display the image at the display area DA. The display area DA of the display device 1000 may be substantially parallel to the plane defined by the first direction DR1 and the second direction DR2. The display device 1000 which is unfolded may display the image in a third direction DR3. Various components or layers of the display device 1000 may include a display area DA and a non-display area NDA corresponding to those described for the display device 1000.

The third direction DR3 which crosses the first direction DR1 and the second direction DR2 may indicate a thickness direction of the display device 1000 and various components or layers thereof. Front (or upper) and rear (or lower) surfaces of each member of the display device 1000 may be opposite to each other in or along the third direction DR3, and a normal line direction of each of the front and rear surfaces may be substantially parallel to the third direction DR3. Directions indicated by the first, second, and third directions DR1, DR2, and DR3 may be relative to each other and may be changed to other directions.

The non-display area NDA may be an area (e.g., a planar area) in which the image is not displayed. The non-display area NDA may be defined adjacent to the display area DA. As shown in FIG. 1, the non-display area NDA may surround the display area DA, however, should not be limited thereto or thereby. According to an embodiment, the non-display area NDA may be defined adjacent to only one side of the display area DA or may be omitted.

The display device 1000 may be a flexible display device that is foldable and/or bendable. In the present disclosure, the term "flexible" used herein with respect to a member may mean that the member has a bendable property, and the flexible display device may have a structure that is bendable to be completely folded, however, should not be limited thereto or thereby. The flexible display device may have a structure in which a portion thereof is bendable.

The display device 1000 may include a folding area FA and at least one or more non-folding area, such as non-folding areas NFA1 and NFA2. The display device 1000 may be foldable at the folding area FA. The display device 1000 which is unfolded may dispose the folding area FA to be flat and the display device 1000 which is folded or bend may dispose the folding area FA to be curved, according to a folding operation of the display device 1000. The non-folding areas NFA1 and NFA2 may be flat even though the display device 1000 is folded. Each of the folding area FA and the non-folding areas NFA1 and NFA2 may be provided in plural and should not be particularly limited. FIG. 1 which shows a first non-folding area NFA1, the folding area FA, and a second non-folding area NFA2, which are sequentially arranged in order in or along the first direction DR1.

Referring to FIGS. 2A to 2C, the display device 1000 may be folded about an imaginary folding axis (hereinafter, the folding axis FX) extending in one direction. FIGS. 2A to 2C shows the display device 1000 folded about the folding axis FX extending in the second direction DR2, however, the direction in which the folding axis FX extends should not be limited thereto or thereby. According to an embodiment, the folding axis FX may extend in the first direction DR1. In this case, the non-folding areas NFA1 and NFA2 may be arranged in the second direction DR2 with the folding area FA interposed therebetween.

The display device 1000 may be folded about the folding axis FX at an angle. FIGS. 2A and 2B show the display device 1000 which is partially folded, and FIG. 2C shows the display device 1000 which is completely folded at the angle of about 180 degrees.

Referring to FIG. 2A, in an embodiment, the folding axis FX may be defined under a rear surface of the display device 1000 which is opposite to the display surface, and the folding area FA of the display device 1000 may form a curved surface convex to the folding axis FX according to the folding operation. This may be referred to as an out-folding state of the display device 1000 which is out-folded. The display device 1000 which is out-folded disposes portions of the display area DA of the display device 1000 exposed to outside the display device 1000 (e.g., facing outwardly). Although not shown in figures, the display device 1000 which is completely out-folded at the angle of about 180 degrees disposes the first non-folding area NFA1 and the second non-folding area NFA2 facing in directions opposite to each other to display the image in the opposite directions.

Referring to FIG. 2B, in an embodiment, the folding axis FX may be defined above a front surface of the display device 1000 and the folding area FA of the display device 1000 may form a curved surface concave to the folding axis FX. This may be referred to as an in-folding state of the display device 1000 which is in-folded. The display device 1000 which is in-folded disposes portions of the display area DA to face each other with respect to a direction. In the display device 1000 which is in-folded, the first non-folding area NFA1 may face the second non-folding area NFA2. As shown in FIG. 2C, the display device 1000 which is completely in-folded at the angle of about 180 degrees may dispose the display area DA not exposed to outside the display device 1000 (e.g., facing inwardly).

A folding operation of the display device 1000 should not be limited to the above-described embodiments and may be designed in various ways.

Figure 3:
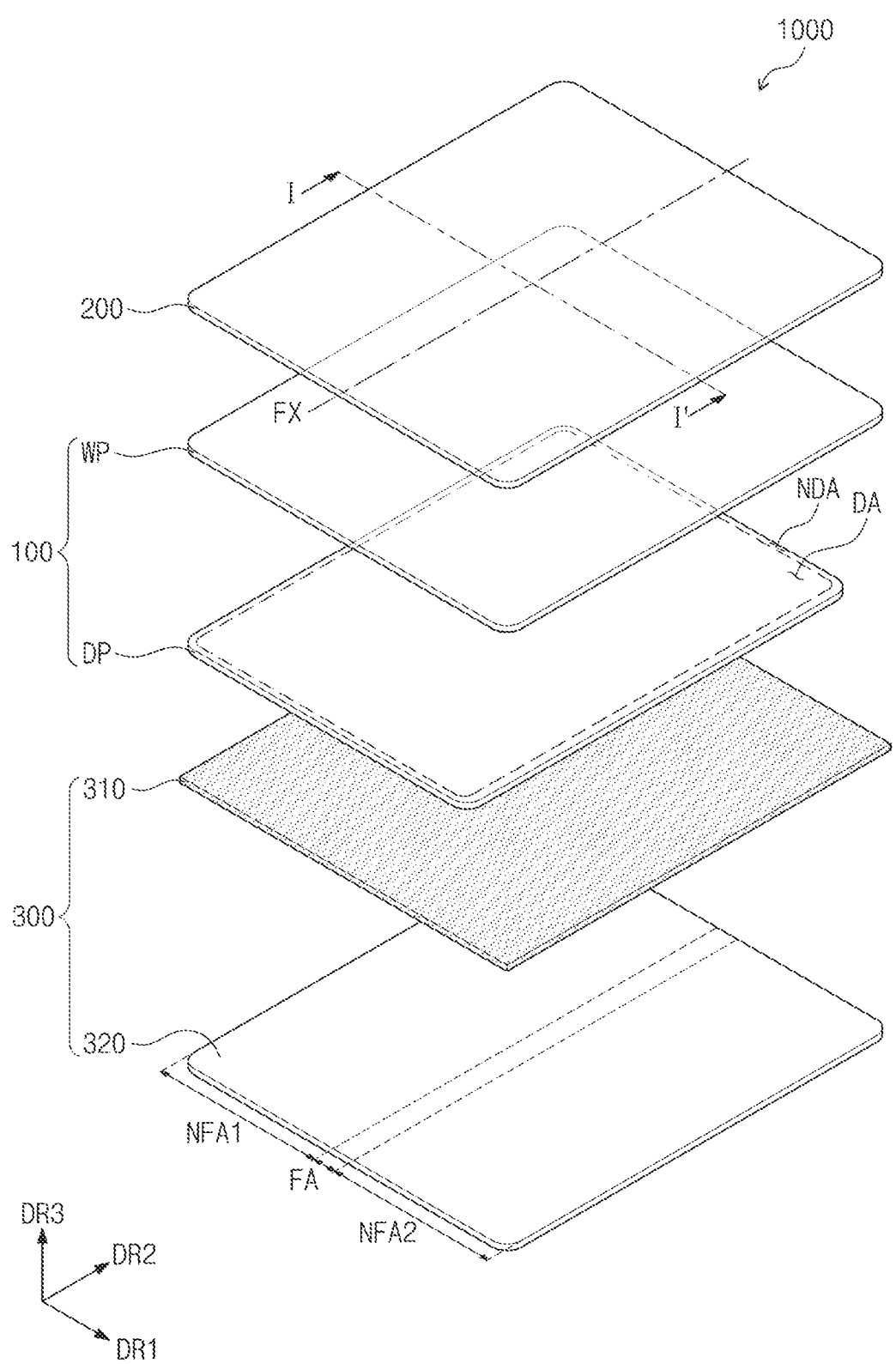
FIG. 3 is an exploded perspective view showing an embodiment of a display device.

FIG. 3 is an exploded perspective view showing an embodiment of the display device 1000. FIG. 3 is an exploded perspective view showing an embodiment of the display device 1000 shown in FIG. 2B. The display device 1000 may include a support module 300, a display module 100, and a protective module 200, which are sequentially stacked in order in the third direction DR3. Each of the support module 300, the display module 100, and the protective module 200 may be foldable about the folding axis FX. That is, the support module 300, the display module 100, and the protective module 200 and various components or layers therein may be foldable together with each other, in folding of the display device 1000.

The display module 100 may be a module that generates an image in response to electrical signals. The display module 100 may include a display panel DP and a window WP.

The display panel DP may generate and/or display the image. The display panel DP may be a liquid crystal display panel or a light-emitting type display panel, however, should not be particularly limited. In an embodiment, for instance, the light-emitting type display panel may be an organic light emitting display panel or a quantum dot light emitting display panel. A light emitting layer of the organic light emitting display panel may include an organic light emitting material. A light emitting layer of the quantum dot light emitting display panel may include a quantum dot or a quantum rod. Hereinafter, the organic light emitting display panel will be described as a representative example of the display panel DP.

The window WP may be disposed on the display panel DP to protect the display panel DP. The window WP may face the display panel DP. The window WP may reduce or effectively prevent the display panel DP from being damaged or malfunctioning due to external impacts to the display device 1000. The window WP may include an optically transparent insulating material. Therefore, the image generated by the display panel DP may be transmitted through the window WP to be visible from outside the display device 1000.

The window WP may include a flexible material. The window WP may be repeatedly folded or unfolded about the folding axis FX. Accordingly, a shape of the window WP may be changed to correspond to the shape of the display panel DP according to the operation of the display device 1000.

The window WP may include a thin glass or a synthetic resin film. The thin glass included in the window WP may have a thickness equal to or smaller than about 100 micrometers, e.g., about 30 micrometers, however, the thickness of the thin glass included in the window WP should not be limited thereto or thereby. The synthetic resin film included in the window WP may include a polyimide (PI) film or a polyethylene terephthalate (PET) film.

The window WP may have a single-layer or multi-layer structure. In an embodiment, for example, the window WP may include a plurality of synthetic resin films coupled to each other by an adhesive, an organic substrate and a synthetic resin film coupled to the organic substrate by an adhesive, or a thin glass and a synthetic resin film coupled to the thin glass by an adhesive, however, should not be particularly limited.

Although not shown in figures, the display module 100 may include at least one functional layer disposed between the display panel DP and the window WP. As an example, the functional layer may be an anti-reflective layer to reduce or effectively prevent an external light from being reflected. The anti-reflective layer may reduce or effectively prevent elements of the display panel DP from being viewable from outside thereof due to the external light incident to the display device 1000 through the front surface of the display device 1000. The anti-reflective layer may include at least one of a retarder, a polarizer, and a color filter.

The protective module 200 may be disposed on the display module 100 (e.g., facing the display module 100) to reduce or effectively prevent the display module 100 from external impacts. The protective module 200 may be in contact with the display module 100. As an example, the protective module 200 may be attached to the window WP of the display module 100. The protective module 200 may include a plurality of adhesive layers and a protective film PF. This will be described in detail later.

The protective module 200 may include an optically transparent material. Accordingly, the image generated by the display panel DP and exiting from the window WP may be transmitted through the protective module 200 to be visible from outside the display device 1000.

The protective module 200 may include a flexible material. The protective module 200 may be repeatedly unfolded or folded about the folding axis FX. Accordingly, a shape of the protective module 200 may be changed to correspond to a shape of the display module 100, which is changed according to the operation of the display device 1000.

The support module 300 may be disposed on a rear surface of the display module 100 and may support the display module 100. The support module 300 may include a cushion layer 310 and a support plate 320.

The cushion layer 310 may be disposed on the rear surface of the display module 100. The cushion layer 310 may absorb the external impacts applied to the display module 100. As an example, the cushion layer 310 may include a sponge, a foam, or a urethane resin. However, a material for the cushion layer 310 should not be limited thereto or thereby, and the cushion layer 310 may include a variety of materials as long as the cushion layer 310 may protect the display module 100 and may absorb the external impacts.

The support plate 320 may be disposed on a rear surface of the cushion layer 310 to support the display module 100 and may reduce or effectively prevent the display module 100 from being deformed. The support plate 320 may face the display module 100 with the cushion layer 310 therebetween. The support plate 320 may have an integral plate shape corresponding to the shape of the display panel DP. The support plate 320 may have a structure that has increased flexibility in an area overlapping or corresponding to the folding area FA, however, should not be limited thereto or thereby. According to an embodiment, the support plate 320 may include two or more plates spaced apart from each other with the folding area FA interposed therebetween, and this will be described in detail with reference to FIGS. 8A and 8B.

The support plate 320 may include a material having a relatively high modulus. As an example, the support plate 320 may include a metal material. In detail, the support plate 320 may include stainless steel, aluminum, or an alloy thereof. However, a material for the support plate 320 should not be limited thereto or thereby, and the support plate 320 may include a variety of materials as long as they may support the display panel DP.

Although not shown in figures, the display device 1000 may further include an input sensing unit disposed on the display panel DP. The display device 1000 may sense an external input applied thereto in various forms. In an embodiment, for example, the external input may include pressure, temperature, or light. The external input may include external inputs in proximity to or approaching close to the display device 1000 at a distance (e.g., a hovering input) as well as a touch input (e.g., a contact) by an input tool such as a body part (e.g., a hand of auser), a pen, etc.

Figure 4:
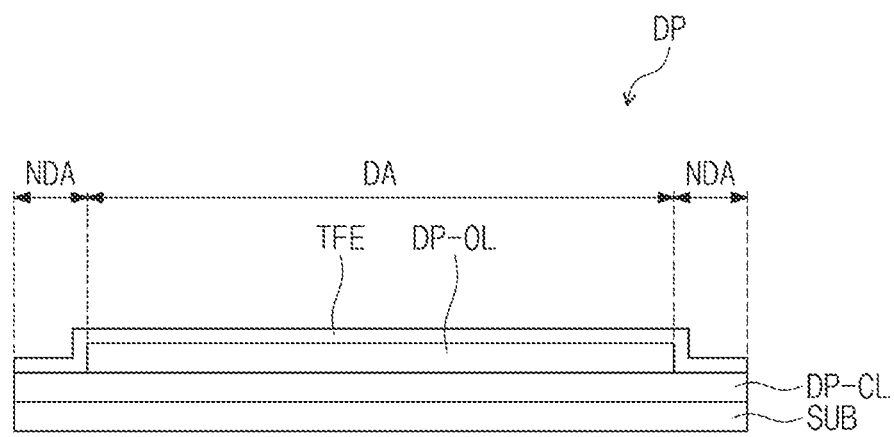
FIG. 4 is a cross-sectional view showing an embodiment of a display panel.
Figure 4:
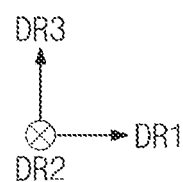

FIG. 4 is a cross-sectional view showing an embodiment of the display panel DP. The display panel DP may include a base substrate SUB, a circuit layer DP-CL, a display element layer DP-OL, and an encapsulation layer TFE.

The base substrate SUB may be flexible. The base substrate SUB may have a single-layer or multi-layer structure. The base substrate SUB may include a plastic substrate, a glass substrate, a metal substrate, or an organic/inorganic composite substrate. The base substrate SUB may include a synthetic resin film. In an embodiment, for example, the synthetic resin film may include a polyimide-based resin, an acrylic-based resin, a vinyl-based resin, an epoxy-based resin, a urethane-based resin, a cellulose-based resin, and a perylene-based resin. However, the synthetic resin film should not be limited thereto or thereby.

The circuit layer DP-CL may be disposed on the base substrate SUB. The circuit layer DP-CL may include an insulating layer, a semiconductor pattern, a conductive pattern, and a signal line. An insulating layer, a semiconductor layer, and a conductive layer may be formed on the base substrate SUB by coating or depositing processes. Then, the insulating layer, the semiconductor layer, and the conductive layer may be selectively patterned by a photolithography process, and thus, the insulating layer, the semiconductor pattern, the conductive pattern, and the signal line, which are included in the circuit layer DP-CL, may be formed or provided.

The display element layer DP-OL may be disposed on the circuit layer DP-CL. The display element layer DP-OL may include a light emitting element disposed to correspond to the display area DA of the display device 1000. In an embodiment, for example, the display element layer DP-OL may include an organic light emitting element, a quantum dot, a quantum rod, a micro-LED, or a nano-LED of the light emitting element.

The display panel DP may include a plurality of pixels generating images in response to electrical signals. Each of the pixels may include the light emitting element included in the display element layer DP-OL and a thin film transistor which is included in the circuit layer DP-CL and electrically connected to the light emitting element. The pixels may be arranged in the display area DA, however, should not be limited thereto or thereby. Some of the pixels may be arranged in the non-display area NDA.

The encapsulation layer TFE may be disposed on the circuit layer DP-CL to cover the display element layer DP-OL. The encapsulation layer TFE may include inorganic layers and an organic layer disposed between the inorganic layers, however, the layers included in the encapsulation layer TFE should not be limited thereto or thereby.

The inorganic layers included in the encapsulation layer TFE may protect the pixels from moisture and oxygen. As an example, the inorganic layers may include a silicon nitride layer, a silicon oxide layer, a silicon oxynitride layer, a titanium oxide layer, or an aluminum oxide layer. The organic layer included in the encapsulation layer TFE may protect the pixels from a foreign substance such as dust particles. As an example, the organic layer may include an acrylic-based organic layer, however, materials for inorganic layer and the organic layer should not be limited thereto or thereby.

Figure 5:
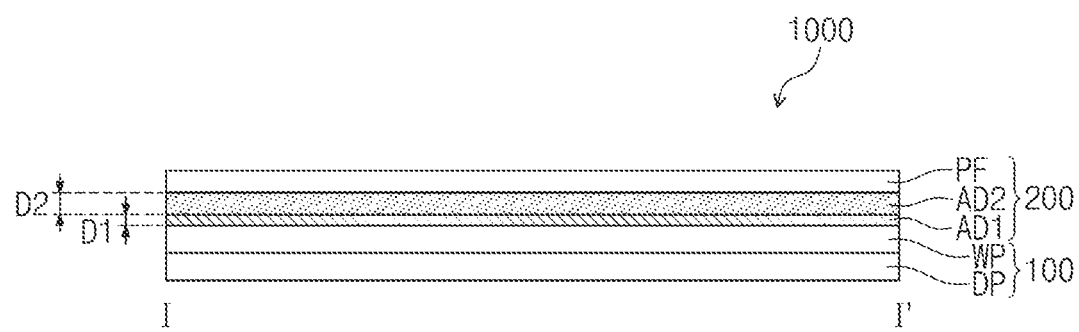
FIG. 5 is a cross-sectional view showing an embodiment of a display device.
Figure 5:
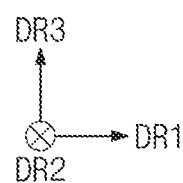

FIG. 5 is a cross-sectional view showing an embodiment of the display device 1000. FIG. 5 is a cross-sectional view showing the display device 1000 taken along line I-I' shown in FIG. 3. FIG. 5 schematically shows the display module 100 and the protective module 200 of the display device 1000.

The protective film PF may include a polymer film. As an example, the polymer film may include at least one polymer resin among polyethyleneterephthalate (PET), polybutylene terephthalate (PBT), polycarbonate (PC), polyethylene naphthalate (PEN), polystyrene (PS), polymethylmethacrylate (PMMA), polyvinylchloride (PVC), polyethersulfone (PES), polypropylene (PP), polyamide (PA), modified polyphenylene ether (m-PPO), polyoxymethylene (POM), polysulfone (PSU), polyphenylene sulfide (PPS), polyimide (PI), polyethyleneimine (PEI), polyetherether ketone (PEEK), polyamide imide (PAI), polyarylate (PAR), and thermoplastic polyurethane (TPU).

The display device 1000 may have a folding property and an impact resistance, which vary depending on a thickness of the protective film PF. When the thickness of the protective film PF is too thin, the display device 1000 may be damaged by external impacts, and when the thickness of the protective film PF is too thick, the folding property of the display device 1000 may be degraded. As an example, the thickness of the protective film PF may be equal to or greater than about 25 micrometers (μm) and equal to or less than about 200 μm. In detail, the thickness of the protective film PF may be equal to or greater than about 50 μm and equal to or less than about 100 μm. However, the thickness of the protective film PF should not be limited thereto or thereby.

A first adhesive layer AD1 and a second adhesive layer AD2 may be disposed between the display module 100 and the protective film PF and may attach the display module 100 to the protective film PF. The first adhesive layer AD1 may be in contact with an upper surface WP-U of the window WP. As being in contact, elements may form an interface or boundary therebetween. The first adhesive layer AD1 may be closer to the display module 100 than the second adhesive layer AD2. The second adhesive layer AD2 may be in contact with an upper surface of the first adhesive layer AD1 and a rear surface of the protective film PF.

Each of the first adhesive layer AD1 and the second adhesive layer AD2 may include a base resin of a pressure sensitive adhesive. As an example, each of the first adhesive layer AD1 and the second adhesive layer AD2 may include at least one of an acrylic-based resin, a silicon-based resin, a urethane-based resin, an epoxy-based resin, a rubber-based resin, and a polyester-based resin and may include one or two or more resins of the same series of resins. The first adhesive layer AD1 and the second adhesive layer AD2 may have an adhesive force that varies depending on a rigidity and a surface energy of the base resin.

Each of the protective film PF, the first adhesive layer AD1, and the second adhesive layer AD2 may include an optically transparent material. Accordingly, the image generated by the display module 100 may be transmitted to outside the display device 1000, through the first and second adhesive layers AD1 and AD2 and the protective film PF in a structure in which the protective film PF is attached to the display module 100 with the first and second adhesive layers AD1 and AD2 interposed therebetween.

The protective module 200 may be optically transparent at room temperature. As an example, the protective module 200 may have a haze value equal to or less than about 4% at room temperature. However, the haze value of the protective module 200 should not be limited thereto or thereby.

The adhesive force of the first adhesive layer AD1 may decrease as a temperature increases from the room temperature to a high temperature (e.g., temperature higher than room temperature). The adhesive force of the first adhesive layer AD1 may vary greatly above a reference temperature. As an example, the first adhesive layer AD1 may have a first adhesive force at room temperature and may have a second adhesive force at high temperature, and the second adhesive force may be reduced to about 50% or more compared with the first adhesive force. In detail, the first adhesive layer AD1 may have the first adhesive force at a temperature of about 25 degrees Celsius and may have the second adhesive force at a temperature of about 70 degrees Celsius, and the second adhesive force may be less than a half of the first adhesive force.

The adhesive force of the second adhesive layer AD2 may gradually decrease as a temperature increases from the room temperature to the high temperature when compared with the adhesive force of the first adhesive layer AD1. The adhesive force between the first adhesive layer AD1 and the window WP at room temperature may be substantially the same as or similar to the adhesive force between the second adhesive layer AD2 and the window WP at room temperature. As an example, the adhesive force between the first adhesive layer AD1 and the window WP and the adhesive force between the second adhesive layer AD2 and the window WP may be equal to or greater than about 400 grams-force per inch (gf/inch) at room temperature.

However, the adhesive force between the first adhesive layer AD1 and the window WP at high temperature may be smaller than the adhesive force between the second adhesive layer AD2 and the window WP at high temperature. As an example, the adhesive force between the second adhesive layer AD2 and the window WP at a temperature of about 80 Degrees Celsius may be about 400 gf/inch, and the adhesive force between the first adhesive layer AD1 and the window WP at the temperature of about 80 Degrees Celsius may be equal to or less than about 50 gf/inch.

As the adhesive force of the first adhesive layer AD1 that is in contact with the window WP is greatly reduced at a reference temperature, the protective film PF may be easily peeled off from the upper surface WP-U of the window WP at high temperature. As an example, when the replacement of the protective film PF is necessary, the protective film PF may be easily peeled off from the display module 100 by applying a heat to the protective film PF, and damage to the display panel DP may be reduced or effectively prevented in the replacement process. That is, heating of the protective film PF reduces an adhesive force of the first adhesive layer AD1 at the interface between the protective module 200 and the display module 100.

The first adhesive layer AD1 may include a side chain crystalline polymer. The side chain crystalline polymer may include a copolymer formed by polymerization of one or more monomers. In an embodiment, for example, the first adhesive layer AD1 may include at least one of a cetyl (meth)acrylate copolymer, a stearyl (meth)acrylate copolymer, an eicosyl (meth)acrylate copolymer, and a behenyl (meth)acrylate copolymer. As the first adhesive layer AD1 includes the side chain crystalline polymer, the degree in variation of the adhesive force of the first adhesive layer AD1 may increase at high temperature.

The second adhesive layer AD2 may have a relatively small modulus. The modulus of the second adhesive layer AD2 may be less than a modulus of the first adhesive layer AD1. As an example, the modulus of the second adhesive layer AD2 may be equal to or less than about 0.2 megapascal (MPa) at minus 20 degrees Celsius. Since the second adhesive layer AD2 has the relatively small modulus, the adhesive layer may not be damaged or deformed even though the display device 1000 is repeatedly folded and unfolded.

The thickness of each of the first adhesive layer AD1 and the second adhesive layer AD2 may affect a folding reliability. The folding reliability may be improved by adjusting the thickness of the first adhesive layer AD1 and the second adhesive layer AD2. As an example, the first thickness D1 of the first adhesive layer AD1 may be equal to or greater than about 5 μm and equal to or less than about 25 μm. The second thickness D2 of the second adhesive layer AD2 may be equal to or greater than about 10 μm and equal to or less than about 100 μm. The first thickness D1 of the first adhesive layer AD1 may be less than the second thickness D2 of the second adhesive layer AD2 within the above-mentioned range, however, should not be limited thereto or thereby.

Figure 6A:
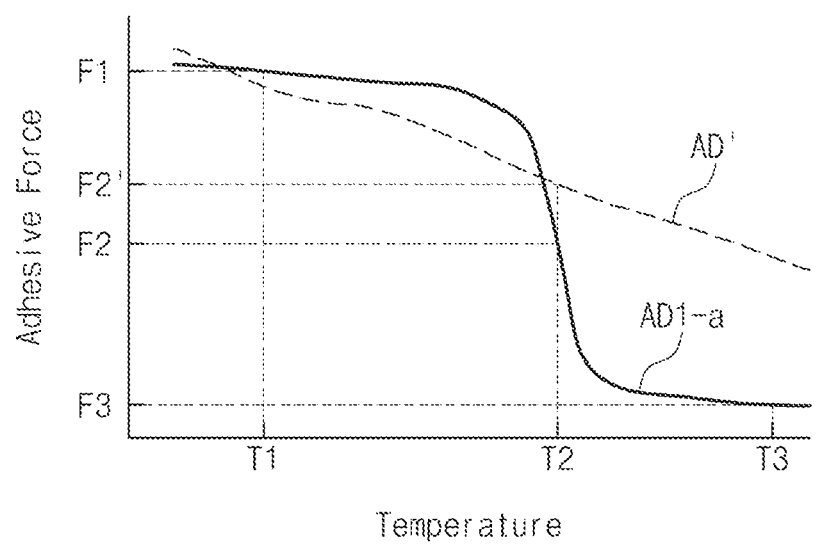
FIG. 6A is a graph showing a relationship between a temperature and an adhesive force of an embodiment and a comparative adhesive layer.
Figure 6B:
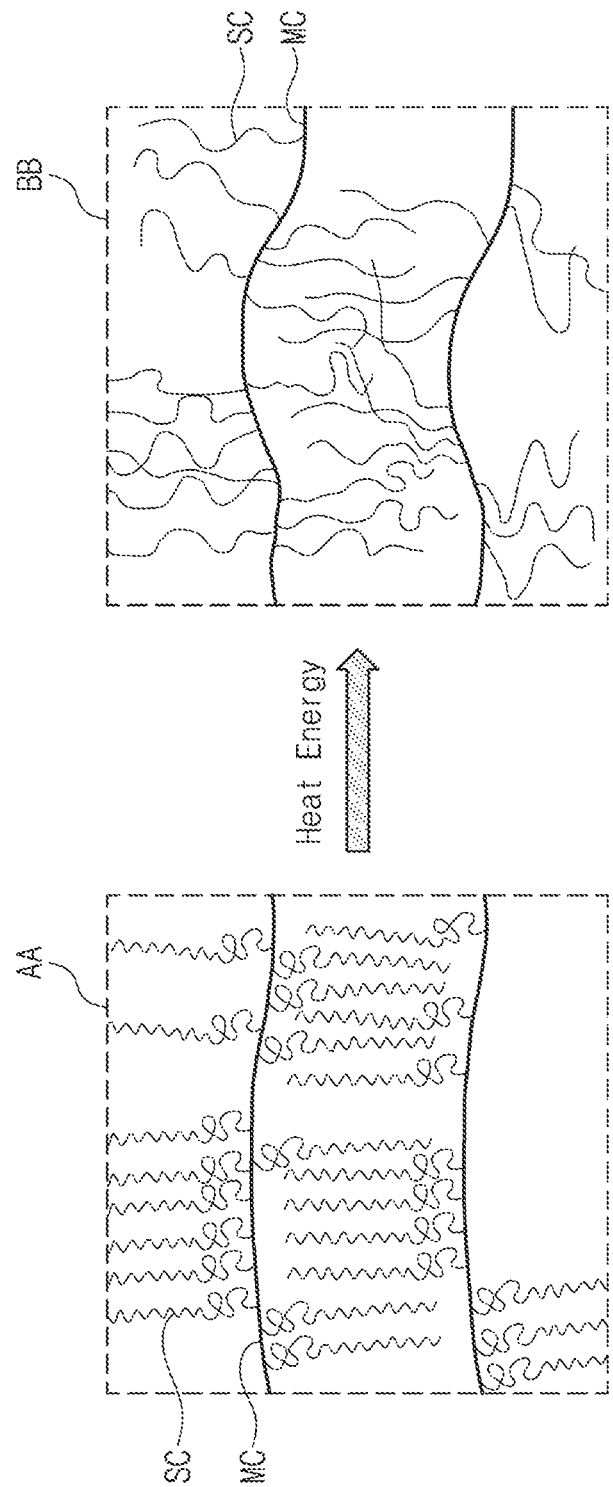
FIG. 6B is a schematic diagram showing an embodiment of a molecular structure of an adhesive layer.

FIG. 6A is a graph showing a relationship between the temperature and the adhesive force of an embodiment of the first adhesive layer AD1-*a* and a comparative adhesive layer AD'. FIG. 6B is a schematic diagram showing an embodiment of a molecular structure of the adhesive layer.

FIG. 6A is a graph schematically showing the adhesive force according to a variation in temperature of a first adhesive layer AD1-*a* corresponding to the above-described first adhesive layer AD1. The first adhesive layer AD1-*a* may include the side chain crystalline polymer. FIG. 6A also shows an adhesive force according to a variation in temperature of a comparative adhesive layer AD' that does not include the side chain crystalline polymer for the comparison with the adhesive force of the first adhesive layer AD1-*a*.

The first adhesive layer AD1-*a* may have a first adhesive force F1 at a first temperature T1. The first temperature T1 may be a room temperature. In a temperature range around the first temperature T1, the adhesive force of the first adhesive layer AD1-*a* may be substantially the same as the first adhesive force F1, or a difference between the adhesive force of the first adhesive layer AD1-*a* and the first adhesive force F1 may be small. On the other hand, in the temperature range around the first temperature T1, the adhesive force of the comparative adhesive layer AD' may be gradually reduced as the temperature increases. In an embodiment, for example, in the temperature range around the first temperature T1, a degree of decrease in the adhesive force of the comparative adhesive layer AD' may be greater than a degree of decrease in the adhesive force of the first adhesive layer AD1-*a*. As the first adhesive layer AD1-*a* maintains the first adhesive force F1 at room temperature, the protective film PF may be attached to the upper surface WP-U of the window WP (refer to FIG. 5) without being peeled off even under the repeated folding and unfolding operations.

The adhesive force of the first adhesive layer AD1-*a* may be maintained at a value even though the temperature increases, and then, may be greatly reduced above a reference temperature. The first adhesive layer AD1-*a* may have a second adhesive force F2 at a second temperature T2 higher than the first temperature T1. The second temperature T2 may be higher than a temperature at which the first adhesive layer AD1-*a* is melted. The second adhesive force F2 may be equal to or less than a half of the first adhesive force F1. As the adhesive force of the first adhesive layer AD1-*a* is greatly reduced at high temperature, the protective film PF (refer to FIG. 5) including the first adhesive layer AD1-*a* contacting the window WP may be easily peeled off from the upper surface WP-U of the window WP (refer to FIG. 5).

Accordingly, the protective film PF may be easily removed from the upper surface WP-U of the window WP by application of heat to the protective film PF, and damage to the display panel DP may be reduced or effectively prevented in the replacement process of the protective film PF within the display device 1000.

On the other hand, a comparative adhesive force F2' of the comparative adhesive layer AD' at the second temperature T2 may be greater than the second adhesive force F2. A degree of decrease in the adhesive force of the first adhesive layer AD1-*a* may be greater than a degree of decrease in the adhesive force of the comparative adhesive layer AD' while the temperature increases from the first temperature T1 to the second temperature T2.

The first adhesive layer AD1-*a* may have a third adhesive force F3 at a third temperature T3 higher than the second temperature T2. A degree of decrease in the adhesive force of the first adhesive layer AD1-*a* may be greater than a degree of decrease in the adhesive force of the comparative adhesive layer AD' while the temperature increases from the second temperature T2 to the third temperature T3. The adhesive force of the first adhesive layer AD1-*a* may be less than the adhesive force of the comparative adhesive layer AD' at the third temperature T3. The third adhesive force F3 may be smaller than the first adhesive force F1 and the second adhesive force F2. As an example, the third temperature T3 may be equal to or greater than about 90 degrees Celsius, and the third adhesive force F3 may be equal to or less than about 10% of the first adhesive force F1.

FIG. 6B schematically shows a molecular structure (diagram AA) of the first adhesive layer AD1-a at the first temperature T1 and a molecular structure (diagram BB) of the first adhesive layer AD1-a at the second temperature T2.

Referring to FIG. 6B, the molecular structure of the first adhesive layer AD1-a may have a crystallized structure in which side chains SC are vertically bonded between main chains MC arranged parallel to each other at room temperature. When the temperature increases due to the heat ('Heat Energy'), molecules of the first adhesive layer AD1-a may have increased degrees of freedom and may be easily entangled with each other. Accordingly, as shown in the diagram BB of FIG. 6B, the side chains SC bonded between the main chains MC may be entangled with each other, and thus, the adhesive force of the first adhesive layer AD1-a may be reduced.

Table 1 below shows a result obtained by evaluating a reliability of the protective module 200 according to the thickness of each of the first adhesive layer AD1 and the second adhesive layer AD2 of embodiment examples and comparative examples. The reliability evaluation of the protective module 200 is performed by measuring the first adhesive force between the protective module 200 and the window WP at a temperature of about 25 degrees Celsius and the second adhesive force between the protective module 200 and the window WP at a temperature of about 80 degrees Celsius. In addition, whether the protective module 200 is peeled off when the display device 1000 is repeatedly folded and unfolded after each of the embodiment protective module and the comparative protective module is applied to a display device 1000, whether the display panel DP is damaged when each respective protective film is replaced, and whether the adhesive layers are changed during the use of the display device 1000 are evaluated.

ing to the second adhesive layer AD2, and comparative example 5 does not include an element corresponding to the first adhesive layer AD1.

In Table 1, "D1" denotes the first thickness of the first adhesive layer AD1, and "D2" denotes the second thickness D2 of the second adhesive layer AD2. "A1" denotes the first adhesive force, and "A2" denotes the second adhesive force. "FR" denotes whether the protective film PF is peeled off during the folding test. In a case that FR is 1, it means that the protective film PF is not peeled off when the display device 1000 is repeatedly folded and unfolded 1,000 times. In a case that FR is smaller than 1 (FR<1), it means that the protective film PF is peeled off when the display device 1000 is repeatedly folded and unfolded less than 1000 times.

The first adhesive force and the second adhesive force is measured by a 180 degree) (°) peel test, and whether the protective film PF is peeled off in the folding test is evaluated by visually observing the peeling of the protective film PF while repeatedly folding and unfolding the display device 1000 in which the protective film PF is attached with the adhesive layers therebetween. Whether the display panel DP is damaged when replacing the protective module 200 is evaluated by visually observing whether the display panel DP is damaged when the protective film PF is separated from the display module 100. Whether the adhesive layers are changed during the use of the display device 1000 is evaluated by visually observing whether the adhesive layers are discolored or deformed when using the display device 1000 after attaching the protective module 200.

In embodiment examples 1 to 5, each thickness of the first adhesive layer AD1 is equal to or greater than about 5 μm and equal to or less than about 25 μm, and each thickness of the second adhesive layer AD2 is equal to or greater than about 10 μm and equal to or less than about 100 μm. In embodiment examples 1 to 5, each first adhesive force is about 500 gf/inch, and each second adhesive force is equal to or less than about 50 gf/inch. In particular, in embodiment example 3 where the thickness of the first adhesive layer is

TABLE 1

|  | E1 | E2 | E3 | E4 | E5 | E6 | C1 | C2 | C3 | C4 | C5 |
|---|---|---|---|---|---|---|---|---|---|---|---|
| D1 (μm) | 5 | 10 | 25 | 5 | 5 | 5 | 30 | 5 | 5 | 25 | — |
| D2 (μm) | 50 | 50 | 50 | 10 | 50 | 100 | 50 | 8 | 120 | — | 50 |
| A1 (gf/in) | 500 | 500 | 500 | 500 | 500 | 500 | 500 | 500 | 500 | 500 | 500 |
| A2 (gf/in) | 50 | 40 | 20 | 50 | 50 | 50 | 50 | 50 | 50 | 50 | 400 |
| FR (1000 times) | 200 | 100 | 100 | 100 | 200 | 200 | <10 | <10 | <1 | <1 | 200 |

In Table 1, "E1 to E6" correspond to embodiment example 1 to embodiment example 6, respectively, and "C1 to C5" correspond to comparative example 1 to comparative example 5. The embodiment examples and the comparative examples may include elements corresponding to elements of the display device 1000 shown in FIG. 5, the first adhesive layer AD1 of each of the embodiment examples and the comparative examples includes the cetyl (meth) acrylate copolymer, and the second adhesive layer AD2 of each of the embodiment examples and the comparative examples includes the acrylic-based resin. However, comparative example 4 does not include an element corresponding about 25 μm, the second adhesive force is about 20 gf/inch, and the adhesive force is greatly reduced at high temperature.

In embodiment examples 1, 5, and 6, the protective film PF is not peeled off and is not damaged even though the display device 1000 is repeatedly folded and unfolded 200,000 times, and in embodiment examples 2 to 4, the protective film PF is not peeled off and is not damaged even though the display device 1000 is repeatedly folded and unfolded 100,000 times.

There are some differences in the thickness of each of the first and second adhesive layers of comparative examples 1 to 3 and embodiment examples. In comparative example 1, the thickness of the first adhesive layer AD1 is about 30 µm exceeding about 25 µm, and the protective film PF is peeled off while the folding and unfolding operations are repeated 100,000 times. In comparative example 2, the thickness of the second adhesive layer AD2 is about 8 µm smaller than about 10 µm, and the protective film PF is peeled off while the folding and unfolding operations are repeated 100,000 times. In comparative example 3, the thickness of the second adhesive layer AD2 is about 120 µm exceeding about 100 µm, and the protective film PF is peeled off while the folding and unfolding operations are repeated 1,000 times. Accordingly, in a case where the thickness of each of the first adhesive layer AD1 and the second adhesive layer AD2 is not within a range, the folding reliability of the display device 1000 may be degraded.

In the comparative example 4 that does not include the second adhesive layer AD2, the protective film PF is peeled off while the folding and unfolding operations are repeated 1,000 times. In the case where the second adhesive layer AD2 is not included, the modulus of the adhesive layer may be greater than that of the adhesive layers of the embodiment examples. Accordingly, when the protective module 200 including the adhesive layer having relatively high modulus is applied to the display device 1000, the folding reliability may be degraded.

The second adhesive force of comparative example 5 that does not include the first adhesive layer AD1 is about 400 gf/inch. In the case where the first adhesive layer AD1 is not included, the adhesive layer may have a relatively great adhesive force at high temperature. Accordingly, although the folding and unfolding operations are repeated 200,000 times, the folding reliability in comparative example 5 is maintained, but the display panel DP is damaged when the protective film PF is separated. This is because it is difficult to separate the protective film PF since the adhesive force of the adhesive layer, which is applied to attach the protective film PF to the display module 100, is great.

In the embodiment examples, the display panel DP is not damaged even though the protective film PF is separated from the display module 100, and the adhesive layers are not discolored or deformed. In addition, the folding reliability is improved in the embodiment examples compared with that in the comparative examples.

When the adhesive force between the adhesive layer and the display module 100 is low, there is an advantage that the protective film PF may be easily removed from the display module 100 when replacing the protective film PF, however, there is a disadvantage that the protective film PF may be easily peeled off due to the repeated folding and unfolding operations. When the adhesive force between the adhesive layer and the display module 100 is high, there is an advantage that the protective film PF is not easily peeled off even though the display device 1000 is repeatedly folded and unfolded, however, there is a disadvantage that the display module 100 is damaged when replacing the protective film PF. Accordingly, it is necessary to control the adhesive force of the adhesive layer, and the adhesive layers of the present disclosure may not be easily peeled off from the display module 100 at room temperature, may have improved folding reliability, and may be easily removed from the display module 100 at high temperature.

Figure 7A:
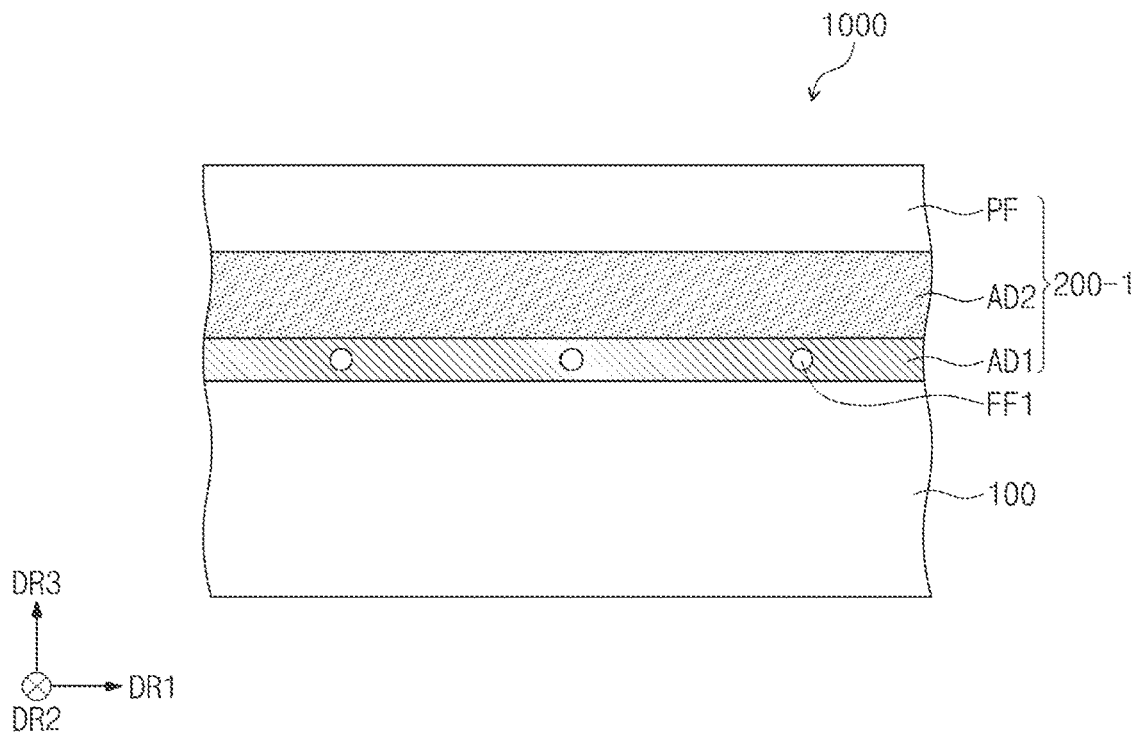
FIGS. 7A to 7C are cross-sectional views showing embodiments of display devices.
Figure 7B:
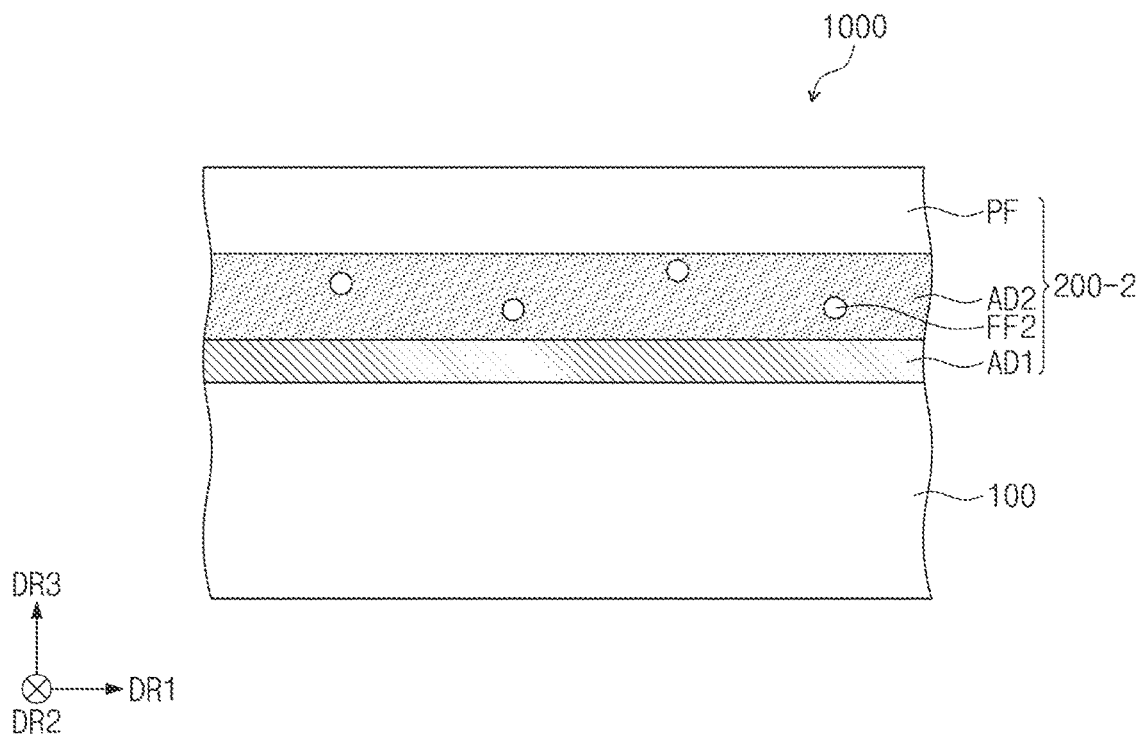
Figure 7C:
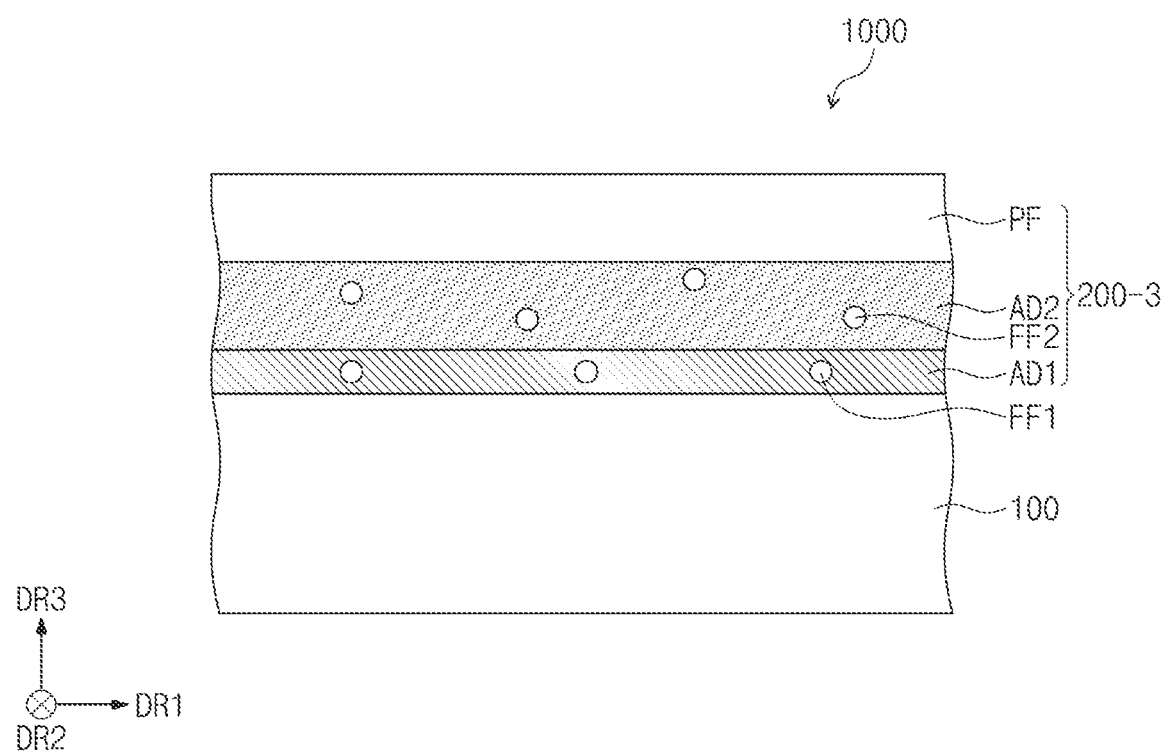

FIGS. 7A to 7C are cross-sectional views showing embodiments of display devices 1000. The display devices 1000 shown in FIGS. 7A to 7C include substantially the same elements as those of the above-described embodiments except some elements. Hereinafter, different features from those of the above-described embodiments will be mainly described.

At least one of adhesive layers AD1 and AD2 may further include foaming agents such as first and/or second foaming agents FF1 and FF2. A protective module 200-1 shown in FIG. 7A may include a first adhesive layer AD1 including a first foaming agent FF1. A protective module 200-2 shown in FIG. 7B may include a second adhesive layer AD2 including a second foaming agent FF2. A protective module 200-3 shown in FIG. 7C may include a first adhesive layer AD1 and a second adhesive layer AD2, which respectively include first and second foaming agents FF1 and FF2.

The foaming agents FF1 and FF2 may be a material whose volume increases when a temperature thereof increases or when an ultraviolet ray (UV) is irradiated thereto. As an example, the foaming agents FF1 and FF2 may include a core portion including an adhesive force control agent and an outer portion which surrounds the core portion. The adhesive force control agent may be vaporized in a condition in which the heat or the ultraviolet ray is provided, and thus, the volume of the foaming agents FF1 and FF2 may increase. As the volume of the foaming agents FF1 and FF2 increases, the adhesive force of the adhesive layer including the foaming agents FF1 and FF2 may be reduced.

The foaming agents FF1 and FF2 may be dispersed in a polymer resin included in the first and second adhesive layers AD1 and AD2. The foaming agents included in a same one adhesive layer may have substantially the same size as each other, however, should not be limited thereto or thereby. According to an embodiment, the foaming agents FF1 and FF2 may have different sizes from each other. The foaming agents FF1 and FF2 may have a spherical shape, however, should not be limited thereto or thereby. According to an embodiment, the foaming agents FF1 and FF2 may have an oval shape.

The protective film PF may be easily separated from the display module 100 due to the adhesive layers AD1 and AD2 including the foaming agents FF1 and FF2 under a heat or UV irradiation condition, and the protective film PF may be replaced without causing damages on the display panel DP. However, when a content of the foaming agents FF1 and FF2 included in the adhesive layers AD1 and AD2 is large, the thickness of the respective adhesive layer may increase, and the modulus of the respective adhesive layer may increase. Accordingly, when the content of the foaming agents FF1 and FF2 is too high, the folding reliability of the display device 1000 may be degraded.

As an example, a content of each of the foaming agents FF1 and FF2 within a respective adhesive layer may be equal to or less than about 3%. In detail, the content of the foaming agent FF1 included in the first adhesive layer AD1 may be equal to or less than about 3% based on a total content (100%) of materials included in the first adhesive layer AD1. The content of the foaming agent FF2 included in the second adhesive layer AD2 may be equal to or less than about 3% based on a total content of materials included in the second adhesive layer AD2.

Figure 8A:
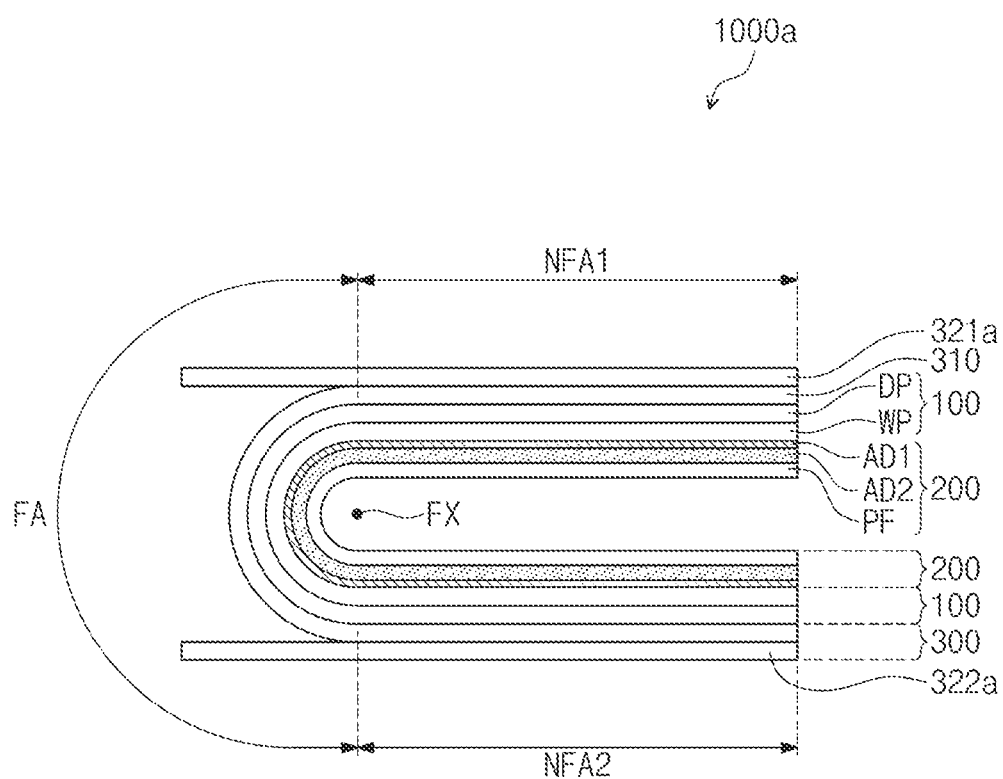
FIGS. 8A and 8B are cross-sectional views showing embodiments of display devices.
Figure 8A:
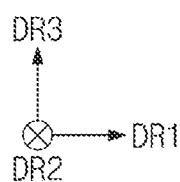
Figure 8B:
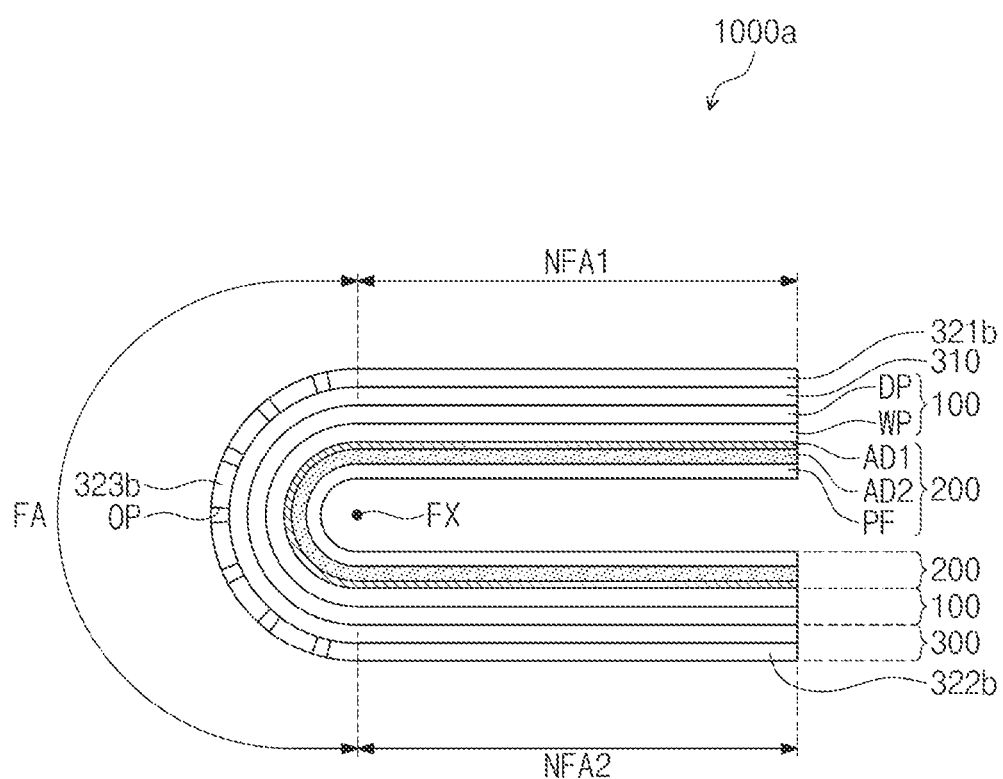

FIGS. 8A and 8B are cross-sectional views showing embodiments of a display device 1000a. FIGS. 8A and 8B are cross-sectional views showing the display devices 1000a which is completely folded (completely in-folded). The above descriptions may be applied to elements of the display devices 1000a. The display devices 1000a respectively shown in FIGS. 8A and 8B may include substantially the same elements except some elements of a support module 300, and hereinafter, different features of the display devices 1000*a* will be mainly described.

Referring to FIG. 8A, the display device 1000*a* may include a support plate 320, and the support plate 320 may include a plurality of supporters 321*a* and 322*a*. The supporters 321*a* and 322*a* may include a first supporter 321*a* overlapping the first non-folding area NFA1 and a second supporter 322*a* overlapping the second non-folding area NFA2.

The display device 1000*a* which is unfolded may dispose the first supporter 321*a* and the second supporter 322*a* spaced apart from each other in the first direction DR1, at the folding area FA. That is, the support plate 320 may be disconnected at the folding area FA. The first supporter 321*a* and the second supporter 322*a* may be spaced apart from each other in an area overlapping the folding area FA. The first supporter 321*a* may support a rear surface of a display module 100 overlapping the first non-folding area NFA1, and the second supporter 322*a* may support the rear surface of the display module 100 overlapping the second non-folding area NFA2.

In the display device 1000*a* which is completely infolded, a rear surface of the first supporter 321*a* and a rear surface of the second supporter 322*a* may face opposite directions to each other. The support plate 320 may include the supporters 321*a* and 322*a* spaced apart from each other, and thus, the support plate 320 may not be folded to have a curvature in the folding area FA when the display device 1000*a* is folded. That is, in the display device 1000*a* which is folded, each of the supporters 321*a* and 322*a* may support the display module 100 while maintaining a flat state and may not be curved or deformed in the folding area FA.

Referring to FIG. 8B, the display device 1000*a* may include a support plate 320 having an integral plate shape. The support plate 320 may include a first portion 321*b* overlapping the first non-folding area NFA1, a second portion 322*b* overlapping the second non-folding area NFA2, and a third portion 323*b* overlapping the folding area FA.

The support plate 320 may be provided with a plurality of openings OP defined in the third portion 323*b* overlapping the folding area FA. The openings OP may be defined through the support plate 320. The openings OP may be arranged in one direction to be spaced apart from each other. As an example, the openings OP may be arranged in a matrix shape or a zigzag shape within the third portion 323*b*, and the arrangement of the openings OP should not be particularly limited. Solid portions of the support plate 320 may alternate with the openings OP to define the third portion 323*b*, without being limited thereto.

Although not shown in figures, the openings OP may be provided as grooves recessed from an upper surface of the support plate 320 without penetrating the support plate 320. The upper surface of the support plate 320 may be closest to the display module 100 without being limited thereto. Accordingly, a thickness of the support plate 320 at a portion of the third portion 323*b* of the support plate 320 may be smaller than a thickness of the support plate 320 at the first portion 321*b* and at the second portion 322*b*.

The display device 1000*a* which is unfolded may define an original size of the openings OP. The display device 1000*a* which is folded may define a size of the openings OP which is larger than the original size due to a tensile force in the display device 1000*a* which is folded. The support plate 320 may be provided with the openings OP defined to overlap the folding area FA, and thus, flexibility of the support plate 320 may be improved.

FIGS. 9A to 9D are perspective views showing embodiments of a display device 1000'. FIGS. 9A to 9D are perspective views showing an embodiment of a replacement process of a damaged protective film PF' of a protective module 200.

Figure 9A:
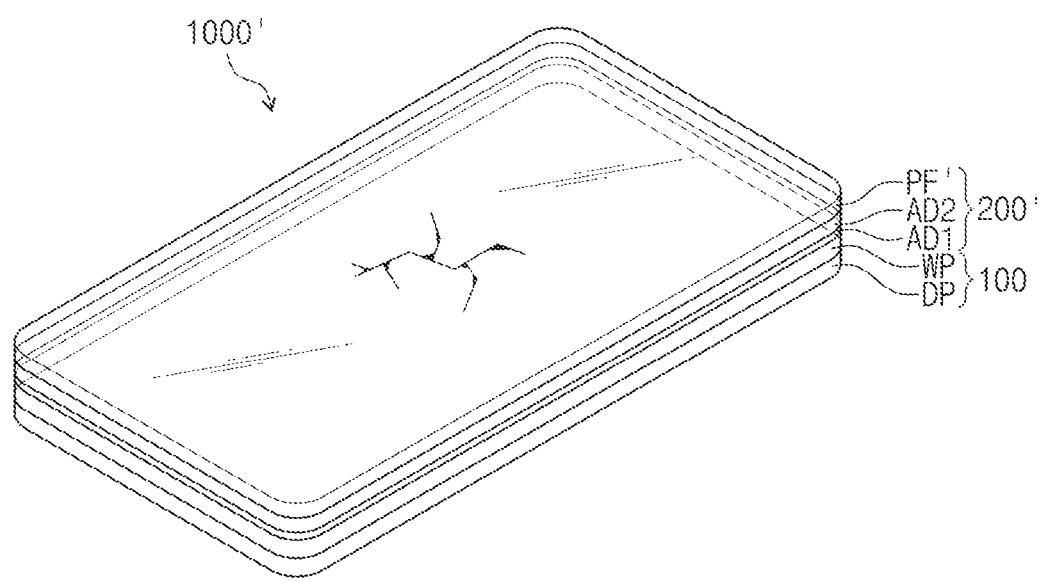
FIGS. 9A to 9D are perspective views showing an embodiment of a replacement process of a protective film.
Figure 9A:
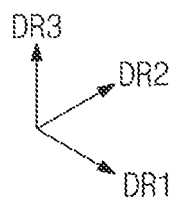

FIG. 9A shows the display device 1000' including a damaged protective module 200' including a damaged protective film PF'. The damaged protective film PF' of the display device 1000' may be damaged due to external impacts or repeated folding and unfolding operations. A replacement of the damaged protective film PF' may be required.

Figure 9B:
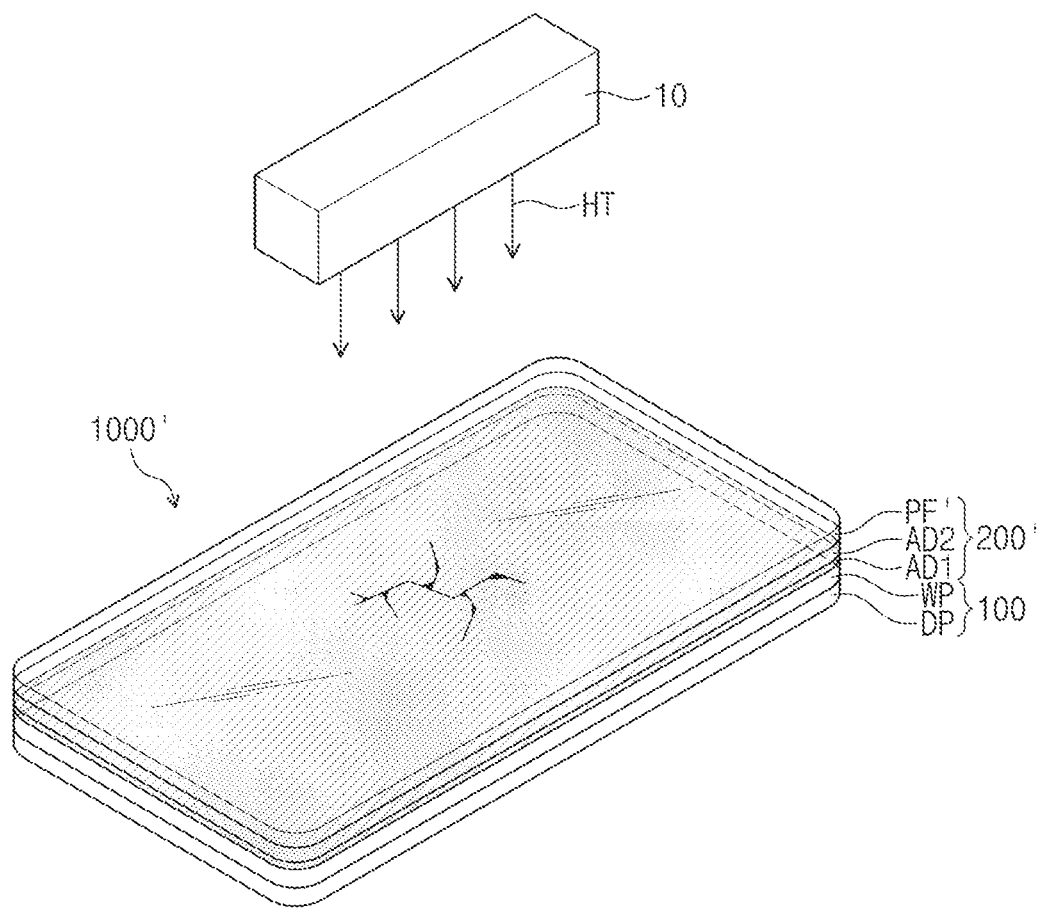

Referring to FIG. 9B, a heat supply device 10 may be provided above the display device 1000' to replace the damaged protective film PF'. The heat supply device 10 may supply a heat HT onto the display device 1000'. Due to the heat HT, a crystallized phase of a first adhesive layer AD1 may be changed. As an example, as shown in FIG. 6B, the molecular structure of the first adhesive layer AD1 may be changed due to the heat HT. Accordingly, as described above, the adhesive force of the first adhesive layer AD1 at high temperature may be greatly reduced when compared with the adhesive force of the first adhesive layer AD1 at room temperature.

Figure 9C:
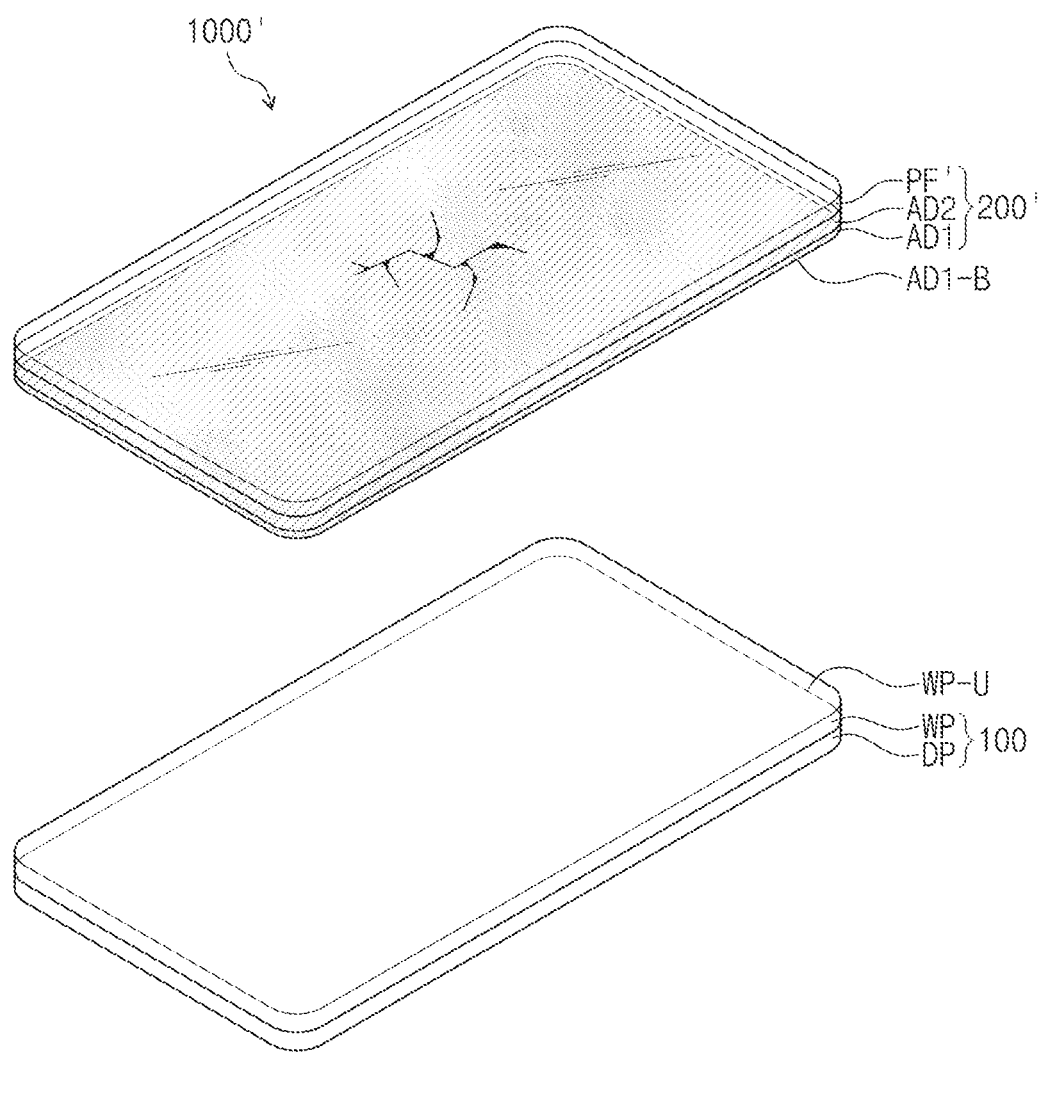

FIG. 9C shows a process of separating the damaged protective film PF', which will be replaced, from an upper surface WP-U of a window WP after supplying the heat HT. The adhesive force of the first adhesive layer AD1 used to attach the damaged protective film PF' to the upper surface WP-U of the window WP may be reduced by the heat HT, and thus, the damaged protective film PF' may be easily separated from the window WP. Accordingly, damage to the display panel DP may be reduced or effectively prevented when the damaged protective film PF' is replaced.

In detail, the first adhesive force may act between a rear surface AD1-B of the first adhesive layer AD1 and the upper surface WP-U of the window WP at room temperature, and the second adhesive force may act between the rear surface AD1-B of the first adhesive layer AD1 and the upper surface WP-U of the window WP at high temperature. The second adhesive force may be reduced to about 50% or more compared with the first adhesive force by application of the heat HT. In an embodiment, for example, the first adhesive force may be about 500 gf/inch at a temperature of about 25 degrees Celsius, and the second adhesive force may be about 50 gf/inch at a temperature of about 80 degrees Celsius.

Figure 9D:
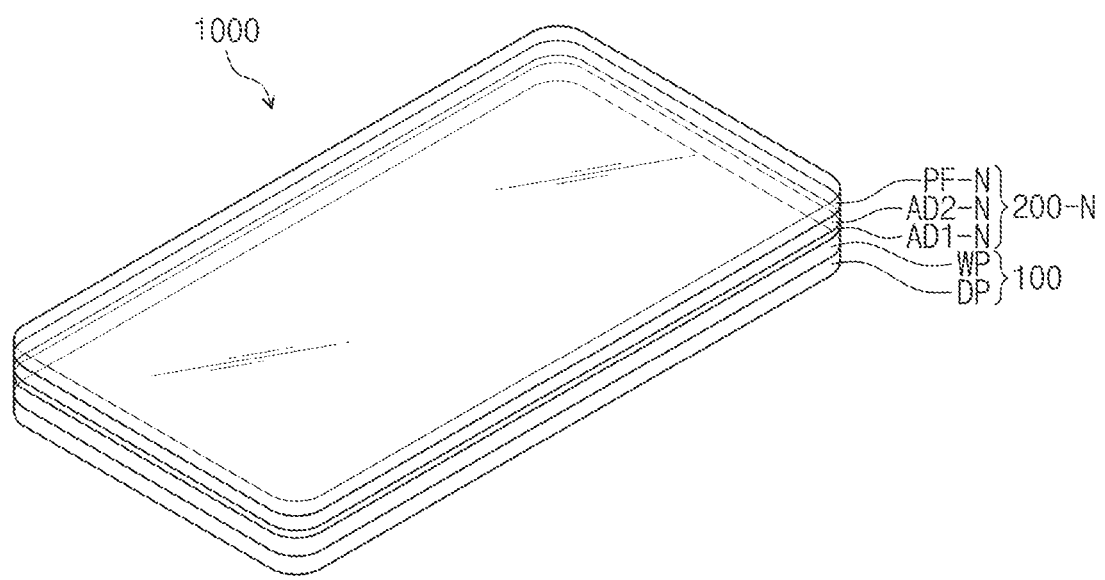
Figure 9D:
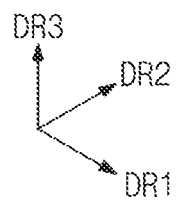

FIG. 9D shows the display device 1000 which is repaired including an undamaged protective module 200-N. The undamaged protective module 200-N may include an undamaged protective film PF-N that is not damaged, a second adhesive layer AD2-N disposed on a rear surface of the undamaged protective film PF-N, and a first adhesive layer AD1-N disposed on a rear surface of the second adhesive layer AD2-N. The undamaged protective module 200-N may be attached to the display module 100 such that the first adhesive layer AD1-N is in contact with the upper surface WP-U of the window WP.

The adhesive force of the first adhesive layer AD1-N at room temperature may be greater than that of the first adhesive layer AD1-N at the high temperature, and the undamaged protective film PF-N may not be easily peeled off from the window WP. That is, the undamaged protective film PF-N may not be easily peeled off even though the display device 1000 is repeatedly folded and unfolded. In addition, although the display device 1000 is repeatedly folded and unfolded, the folding reliability may be maintained by the second adhesive layer AD2-N having the relatively small modulus.

The display device 1000 may include the protective film PF and the adhesive layers which are disposed under the protective film PF. The adhesive layers may include the adhesive layer having the relatively small modulus and the adhesive layer having the adhesive force with the high degree of variability at high temperature. The folding reliability of the display device 1000 may not be degraded by the adhesive layers even though the display device 1000 is repeatedly folded and unfolded, and the protective film PF may not be easily peeled off from the display module. In addition, the protective film PF may be easily removed from the display module 100 by the adhesive layers at high temperature, and the protective film PF may be replaced without causing damages on the display module 100.

Although the embodiments of the present disclosure have been described, it is understood that the present disclosure should not be limited to these embodiments but various changes and modifications can be made by one ordinary skilled in the art within the spirit and scope of the present disclosure as hereinafter claimed.

Therefore, the disclosed subject matter should not be limited to any single embodiment described herein, and the scope of the invention shall be determined according to the attached claims.

What is claimed is:
1. A display device comprising:
   a display panel foldable about a folding axis extending in a first direction;
   a window facing the display panel;
   a protective film facing the display panel with the window therebetween; and
   a plurality of adhesive layers between the window and the protective film and coupling the window to the protective film, the plurality of adhesive layers comprising in order from the window to the protective film:
      a first adhesive layer comprising a side chain crystalline polymer and a modulus; and
      a second adhesive layer facing the first adhesive layer and comprising a modulus which is less than the modulus of the first adhesive layer.

2. The display device of claim 1, wherein among the first adhesive layer and the second adhesive layer which are in order from the window to the protective film:
   the first adhesive layer has a first adhesive force at room temperature and has a second adhesive force at a temperature equal to or greater than about 70 degrees Celsius, and
   the second adhesive force is equal to or less than about 50% of the first adhesive force.

3. The display device of claim 2, wherein at the temperature equal to or greater than about 70 degrees Celsius, the second adhesive layer has an adhesive force which is greater than the second adhesive force of the first adhesive layer.

4. The display device of claim 1, wherein the side chain crystalline polymer comprises at least one of a cetyl (meth)acrylate copolymer, a stearyl (meth)acrylate copolymer, an eicosyl (meth)acrylate copolymer, and a behenyl (meth)acrylate copolymer.

5. The display device of claim 1, wherein among the first adhesive layer and the second adhesive layer which are in order from the window to the protective film:
   each of the first adhesive layer and the second adhesive layer has a thickness, and
   the thickness of the first adhesive layer is smaller than the thickness of the second adhesive layer.

6. The display device of claim 1, wherein among the first adhesive layer and the second adhesive layer which are in order from the window to the protective film, the first adhesive layer has a thickness equal to or greater than about 5 micrometers and equal to or less than about 25 micrometers.

7. The display device of claim 1, wherein among the first adhesive layer and the second adhesive layer which are in order from the window to the protective film, the second adhesive layer has a thickness equal to or greater than about 10 micrometers and equal to or less than about 100 micrometers.

8. The display device of claim 1, wherein the modulus of the second adhesive layer is about 0.2 megapascal at minus 20 degrees Celsius.

9. The display device of claim 1, wherein the first adhesive layer or the second adhesive layer further comprises a foaming agent.

10. The display device of claim 9, wherein among the first adhesive layer and the second adhesive layer which are in order from the window to the protective film:
    the first adhesive layer comprises the foaming agent at a content based on a total content, and
    the content of the foaming agent in the first adhesive layer is equal to or less than about 3%.

11. The display device of claim 9, wherein among the first adhesive layer and the second adhesive layer which are in order from the window to the protective film:
    the second adhesive layer comprises the foaming agent at a content based on a total content, and
    the content of the foaming agent in the second adhesive layer is equal to or less than about 3%.

12. The display device of claim 1, further comprising:
    the display panel comprising a first non-folding area, a folding area, and a second non-folding area arranged in order along a second direction crossing the first direction, and
    a support module facing the protective film with the display panel therebetween, the support module comprising in order from the display panel:
    a cushion layer facing the display panel; and
    a support plate facing the cushion layer.

13. The display device of claim 12, wherein the support plate of the support module comprises:
    a first supporter corresponding to the first non-folding area of the display panel; and
    a second supporter spaced apart from the first supporter along the second direction and corresponding to the second non-folding area of the display panel.

14. The display device of claim 12, wherein a portion of the support plate corresponds to the folding area of the display panel and defines a plurality of openings corresponding to the folding area of the display panel.

15. A display device comprising:
    a display panel foldable about a folding axis;
    a window facing the display panel;
    a protective film facing the display panel with the window therebetween; and
    a plurality of adhesive layers between the window and the protective film and coupling the window to the protective film, the plurality of adhesive layers comprising in order between the window and the protective film:

a first adhesive layer comprising a first adhesive force at room temperature and a second adhesive force at a temperature equal to or greater than about 70 degrees Celsius; and a second adhesive layer in contact with the first adhesive layer and comprising a third adhesive force at the temperature equal to or greater than about 70 degrees Celsius, wherein the second adhesive force of the first adhesive layer is less than the third adhesive force of the second adhesive layer, and the second adhesive force of the first adhesive layer is equal to or less than about 50% of the first adhesive force of the first adhesive layer.

16. The display device of claim 15, wherein among the first adhesive layer and the second adhesive layer which are in order from the window to the protective film:

each of the first adhesive layer and the second adhesive layer has a thickness, the thickness of the first adhesive layer is equal to or greater than about 5 micrometers and equal to or less than about 25 micrometers, and the thickness of the second adhesive layer is equal to or greater than about 10 micrometers and equal to or less than about 100 micrometers.

17. The display device of claim 15, wherein among the first adhesive layer and the second adhesive layer which are in order from the window to the protective film, the first adhesive layer comprises a side chain crystalline polymer.

18. The display device of claim 17, wherein the side chain crystalline polymer comprises at least one of a cetyl (meth)acrylate copolymer, a stearyl (meth)acrylate copolymer, an eicosyl (meth)acrylate copolymer, and a behenyl (meth)acrylate copolymer.

19. The display device of claim 15, wherein among the first adhesive layer and the second adhesive layer which are in order from the window to the protective film:

each of the first adhesive layer and the second adhesive layer has a modulus, and the modulus of the second adhesive layer is less than the modulus of the first adhesive layer.

20. The display device of claim 15, wherein the first adhesive layer or the second adhesive layer further comprises a foaming agent.

\* \* \* \* \*